United States Patent
Yoshikawa et al.

(10) Patent No.: US 9,812,300 B2
(45) Date of Patent: Nov. 7, 2017

(54) SILICON TARGET FOR SPUTTERING FILM FORMATION AND METHOD FOR FORMING SILICON-CONTAINING THIN FILM

(71) Applicant: Shin-Etsu Chemical Co., Ltd., Chiyoda-ku (JP)

(72) Inventors: Hiroki Yoshikawa, Niigata (JP); Yukio Inazuki, Niigata (JP); Hideo Kaneko, Niigata (JP)

(73) Assignee: Shin-Etsu Chemical Co., Ltd., Chiyoda-ku (JP)

( * ) Notice: Subject to any disclaimer, the term of this patent is extended or adjusted under 35 U.S.C. 154(b) by 0 days.

(21) Appl. No.: 14/312,192

(22) Filed: Jun. 23, 2014

(65) Prior Publication Data

US 2014/0318948 A1   Oct. 30, 2014

Related U.S. Application Data

(63) Continuation of application No. 13/302,543, filed on Nov. 22, 2011, now abandoned.

(30) Foreign Application Priority Data

Dec. 6, 2010   (JP) ................. 2010-271796

(51) Int. Cl.
*H01J 37/34* (2006.01)
*C23C 14/06* (2006.01)
(Continued)

(52) U.S. Cl.
CPC ...... *H01J 37/3426* (2013.01); *C23C 14/0676* (2013.01); *C23C 14/14* (2013.01); *C23C 14/3407* (2013.01); *C23C 14/3414* (2013.01)

(58) Field of Classification Search
CPC .............................. C23C 14/14; H01J 37/3426
See application file for complete search history.

(56) References Cited

U.S. PATENT DOCUMENTS 4,231,816 A   11/1980   Cuomo et al.
4,329,699 A   5/1982   Ishihara et al.
(Continued)

FOREIGN PATENT DOCUMENTS

JP   63-60274 A   3/1988
JP   6-192828 A   7/1994
(Continued)

OTHER PUBLICATIONS

Novikov, Alexander. "Experimental measurement of work function in doped silicon surfaces." Solid State Electronics 54 (2010) 8-13. Oct. 23, 2009.*

(Continued)

*Primary Examiner* — Jason M Berman
(74) *Attorney, Agent, or Firm* — Oblon, McClelland, Maier & Neustadt, L.L.P.

(57) ABSTRACT

A silicon target for sputtering film formation which enables formation of a high-quality silicon-containing thin film by inhibiting dust generation during sputtering film formation is provided. An n-type silicon target material 10 and a metallic backing plate 20 are attached to each other via a bonding layer 40. A conductive layer 30 made of a material having a smaller work function than that of the silicon target material 10 is provided on a surface of the silicon target material 10 on the bonding layer 40 side. That is, the silicon target material 10 is attached to the metallic backing plate 20 via the conductive layer 30 and the bonding layer 40. In a case of single-crystal silicon, a work function of n-type silicon is generally 4.05 eV. A work function of a material of the conductive layer 30 needs to be smaller than 4.05 eV.

9 Claims, 2 Drawing Sheets

(51) Int. Cl.
  *C23C 14/34* (2006.01)
  *C23C 14/14* (2006.01)

(56) References Cited

U.S. PATENT DOCUMENTS

| | | | | | |
|---|---|---|---|---|---|
| 5,306,950 | A | * | 4/1994 | Fujikawa | ................ H01L 24/02 |
| | | | | | 257/509 |
| 5,320,984 | A | * | 6/1994 | Zhang | .................... C23C 14/35 |
| | | | | | 204/192.25 |
| 5,660,700 | A | * | 8/1997 | Shimizu | ................ C03C 17/002 |
| | | | | | 204/192.12 |
| 2008/0271997 | A1 | * | 11/2008 | Facey | ................ H01J 37/3435 |
| | | | | | 204/298.13 |

FOREIGN PATENT DOCUMENTS

| | | |
|---|---|---|
| JP | 7-60557 A | 3/1995 |
| JP | 7-268616 | 10/1995 |
| JP | 2003-322955 | 11/2003 |

OTHER PUBLICATIONS

Office Action dated Apr. 23, 2013, in Japanese Patent Application No. 2010-271796.

\* cited by examiner

SILICON TARGET FOR SPUTTERING FILM FORMATION AND METHOD FOR FORMING SILICON-CONTAINING THIN FILM

CROSS REFERENCES TO RELATED APPLICATIONS

This application is a Continuation of U.S. application Ser. No. 13/302,543, filed on Nov. 22, 2011, and claims priority to Japanese Patent Application No. 2010-271796, filed on Dec. 6, 2010.

BACKGROUND OF THE INVENTION

Field of the Invention

The present invention relates to a silicon target for sputtering film formation and a method for forming a silicon-containing thin film.

Description of the Related Art

Silicon-containing thin films such as a silicon film, a silicon oxide film, a silicon nitride film, and a silicon nitride-oxide film are used in various fields. For example, the silicon-containing thin films are used as an insulator film and a dielectric film in the field of semiconductor devices, as an antireflective film in the field of optical materials, or as a light-shielding film and a phase-shifting film in the field of photomask technology.

A sputtering method using a silicon-containing target material has been widely used to form the silicon-containing thin films for reasons that the method can be performed at low cost, there are relatively few material restrictions therein, and the method is highly controllable.

The silicon-containing target material is generally attached to a metallic backing plate via a conductive bonding material such as indium and tin. A voltage is applied to the backing plate, and the voltage passes through the bonding material to the silicon target material. Heat is thereby generated due to electric resistance. Thus, oxygen-free copper or the like having excellent cooling efficiency and conductivity is generally used for the backing plate.

A silicon target material is a typical silicon-containing target material. To improve wettability with the bonding material, an "adhesive layer" of copper, chromium, nickel or the like having a thickness of about 1 to 10 μm is preferably provided on a bonding surface of the target material (Japanese Patent Laid-Open No. 07-268616).

When the target material has high electric resistance, abnormal electrical discharge such as arc discharge may occur during sputtering. Thus, the target material preferably has low electric resistance. There has been proposed a silicon target material whose resistance is lowered by adding a dopant such as boron (Japanese Patent Laid-Open No. 2003-322955).

The present inventors conducted an experiment on forming a silicon compound thin film for use as a light-shielding film or a phase-shifting film on photomask blanks by using a silicon target material whose resistance is lowered by adding a dopant and whose conductive type is n-type, and confirmed a phenomenon that a more amount of dust is generated therein in comparison with a target material made of a transition metal material or the like.

The inventors also confirmed that the amount of dust generated when the n-type silicon target material is used is not reduced even when an electric resistivity is lowered by increasing an amount of donor added to the silicon target material. The generated dust causes a defect in the formed silicon-containing thin film, and thereby deteriorates the film quality.

The present invention has been made to solve the above problems, and it is an object of the present invention to provide a silicon target for sputtering film formation which enables formation of a high-quality silicon-containing thin film by inhibiting dust generation during sputtering film formation.

SUMMARY OF THE INVENTION

To achieve the above object, a silicon target for sputtering film formation according to the present invention is a silicon target for sputtering film formation in which a silicon target material is attached to a metallic backing plate via a bonding material, wherein the silicon target material is made of silicon whose conductive type is n-type, and a conductive layer made of a material having a smaller work function than that of the silicon target material is provided on a surface of the silicon target material on the bonding material side.

Preferably, the conductive layer contains one of a lanthanoid element, a rare-earth element, an alkali metal element, and an alkali-earth metal element.

More preferably, the conductive layer contains one of Y and lanthanoid.

Preferably, the silicon target material has a volume resistivity of 1 Ωcm or more as electric resistance at a room temperature.

Preferably, the silicon target material is single crystal.

In a method for forming a silicon-containing thin film according to the present invention, sputtering is performed by a gas containing nitrogen and argon by using the above target.

In the present invention, the conductive layer made of the material having a smaller work function than that of the n-type silicon target material is provided on the bonding surface of the target material. Accordingly, charge-up during sputtering film formation is reduced, and dust generation is inhibited. As a result, a high-quality silicon-containing thin film can be formed.

DETAILED DESCRIPTION OF THE PREFERRED EMBODIMENTS

In the following, a silicon target for sputtering film formation according to the present invention will be specifically described by reference to the drawings.

As a result of earnest study on inhibition of dust generation when a silicon-containing thin film is formed by sputtering by use of a silicon target material whose conductive type is n-type, the present inventors have concluded that the dust generation is caused by charge-up occurring in a bonding portion between the n-type silicon target material and a backing plate.

A conventional silicon target material is bonded to a metallic backing plate via a bonding layer. The bonding layer is made of a bonding material having a low melting point such as metal like In and Sn, or alloy thereof. When the bonding layer is bonded to the target material, a metal film may be formed on a bonding surface of the target material in order to improve the wettability of the bonding surface and the adhesion strength thereof (Japanese Patent Laid-Open No. 07-268616).

According to the study by the present inventors, if the material is not selected in consideration of an electric energy barrier in a bonding portion between the n-type silicon target material and the bonding layer, charge-up occurs due to the electric energy barrier generated in the bonding interface, and thereby causes dust generation.

Based on the finding, the present invention provides a silicon target for sputtering film formation in which a target material made of silicon whose conductive type is n-type is attached to a metallic backing plate via a bonding material (a bonding layer), wherein a conductive layer made of a material having a smaller work function than that of the silicon target material is provided on a surface of the silicon target material on the bonding material side. An electric energy barrier is thereby prevented from being generated in an attachment region, so that dust generation is inhibited. The work function means smallest energy required for removing an electron to infinity from a material surface.

Figure 1:
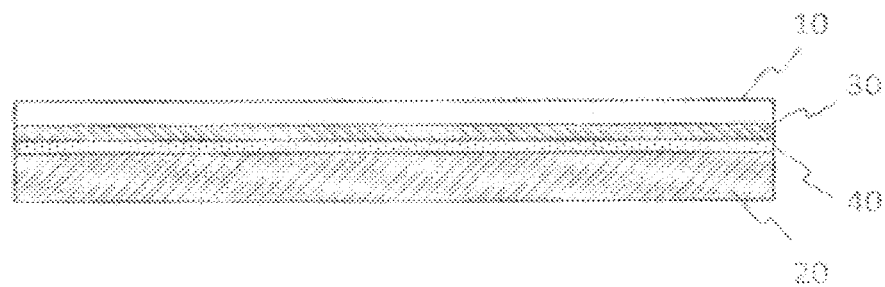
FIG. 1 is a schematic sectional view for explaining the configuration of a silicon target for sputtering film formation according to the present invention.

FIG. 1 is a schematic sectional view for explaining the configuration of the silicon target for sputtering film formation according to the present invention. In the drawing, reference numeral 10 denotes a target material made of silicon whose conductive type is n-type, and reference numeral 20 denotes a metallic backing plate. The n-type silicon target material 10 and the metallic backing plate 20 are attached to each other via a bonding layer 40. A conductive layer 30 made of a material having a smaller work function than that of the silicon target material 10 is provided on a surface of the silicon target material 10 on the bonding layer 40 side. That is, the silicon target material 10 is attached to the metallic backing plate 20 via the conductive layer 30 and the bonding layer 40.

Figure 2A:
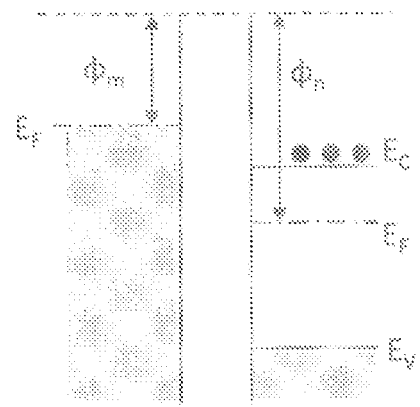
FIGS. 2A and 2B are respectively a band diagram of an n-type silicon target material and a conductive layer, and a band diagram in which the n-type silicon target material and the conductive layer are bonded together.
Figure 2B:
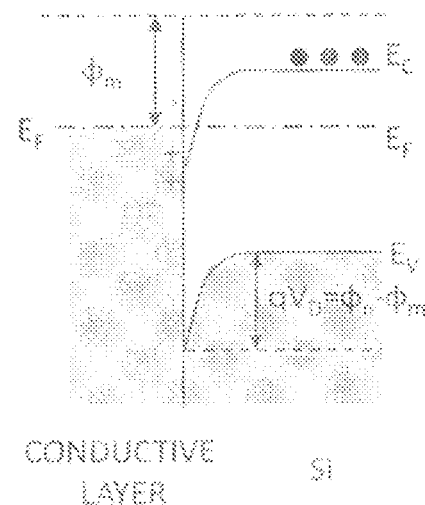

FIGS. 2A and 2B are respectively a band diagram of the n-type silicon target material and the conductive layer, and a band diagram in which the n-type silicon target material and the conductive layer are bonded together.

The present inventors noted a difference between the work function of the n-type silicon target material as a semiconductor and the work function of the conductive layer in contact therewith. It is assumed that a work function $\Phi m$ of the conductive layer is larger than a work function $\Phi n$ (4.05 eV) of the n-type silicon target material. In this case, when a voltage is applied during film formation, bonding surfaces of the conductive layer and the target material are brought into rectifying contact with the conductive layer side in the voltage direction being negative and the n-type silicon target material side being positive. Thus, a current flow is blocked, and a sufficient amount of electrons cannot be held in a region in the vicinity of the surface of the target material. Charge is also not sufficiently released, so that abnormal electrical discharge occurs.

Meanwhile, in a case in which the work function $\Phi m$ of the conductive layer is smaller than the work function $\Phi n$ of the n-type silicon target material as shown in FIGS. 2A and 2B, the bonding surfaces of the conductive layer and the n-type silicon target material are brought into so-called ohmic contact even when a voltage is applied during film formation as described above. Thus, no energy barrier is generated in the bonding surfaces, to thereby suppress abnormal electrical discharge.

Accordingly, in the present invention, since the conductive layer made of the material having a smaller work function than that of the n-type silicon target material is provided, charge-up is reduced. An amount of dust generated during sputtering film formation can be thereby substantially reduced.

When the work function of the conductive layer is larger than the work function of the n-type silicon target material, the energy barrier is generated in the bonding surface of the n-type silicon target material to block a current flow. Accordingly, abnormal electrical discharge occurs, or it becomes difficult to cause sputtering discharge.

In a case of single-crystal silicon, the work function of the n-type silicon is generally 4.05 eV. Therefore, the work function of the material used for the conductive layer needs to be smaller than 4.05 eV. A material containing a lanthanoid element, a rare-earth element, an alkali metal element, and an alkali-earth metal element as a main component may be used as the above material. The conductive layer according to the present invention preferably contains one of the lanthanoid element, the rare-earth element, the alkali metal element, and the alkali-earth metal element. The material may also be a compound such as a boride and a carbide containing the above elements. The material may further contain oxygen and the like.

More specifically, examples of the lanthanoid element include La, Ce, Nd, Sm, Eu, Gd, and Tb. Examples of the rare-earth element include Y and Sc. Examples of the alkali metal element include Li, Na, and K. Examples of the alkali-earth metal element include Mg, Ca, Sr, and Ba. A compound such as GaAs and TaN may be also used as the conductive layer material. Particularly, Y has a low work function of 3.1 eV, is stable in the air, and is thus preferably used as the material.

As long as the electric barrier generated in the bonding surfaces of the silicon target material and the conductive layer can be sufficiently eliminated, the thickness of the conductive layer may be set to any value, and is set to 0.1 to 10 μm, for example.

As long as the silicon target material used in the present invention is made of the n-type silicon, the silicon target material may be single crystal or multi crystal, or may be a cast or a sintered body. Since the single-crystal silicon has a high density and less voids, dust generation and abnormal electrical discharge are difficult to occur.

It is also preferable to preliminarily remove a processing-strained layer from the surface (the bonding surface) of the silicon target material on the bonding layer side by etching or the like. The target material can be prevented from cracking by removing the processing-strained layer. Although the silicon target material may have a smooth bonding surface, a rough surface is more preferably employed to improve an electric contact with the conductive layer.

To roughen the bonding surface of the silicon target material without the processing strain, it is preferable to perform etching such as wet etching or dry etching on the bonding surface. By the etching, the bonding surface of the silicon target material can be finely and homogeneously roughened.

To form the conductive layer on the bonding surface of the silicon target material, a general metalizing method may be used. Examples of the method include a sputtering method, an evaporation method and a plating method.

The backing plate may be made of a general material such as oxygen-free copper and aluminum.

The bonding layer may be also made of a general material such as indium, tin, or alloy thereof.

A metal layer of Cr or the like may be provided between the conductive layer and the bonding layer to improve the wettability and the adhesion.

The silicon target according to the present invention may be used for formation of a silicon-containing thin film by both of DC sputtering and RF sputtering. From the perspective of inhabitation of dust generation, the DC sputtering is more preferable. This is because the DC sputtering is more easily affected by an electric bonding state between the silicon target material and the backing plate.

The silicon target according to the present invention may be used for magnetron sputtering, and may be also used as a facing target.

There are no special restrictions on sputtering film formation conditions by using the target of the present invention. An inert gas such as Ar, He and Ne may be used as a sputtering gas. An oxygen gas, a nitrogen gas, a nitric oxide gas, a hydrocarbon gas, carbon monoxide or carbon dioxide may be also used. A gas containing nitrogen and Ar is preferably used for performing the sputtering.

The target is not limited to a particular shape, and may have a plate-like shape or a conical shape. In the case of the plate-like shape, any shape such as a circular plate shape, a rectangular shape and a doughnut shape may be employed.

By using the silicon target for sputtering film formation according to the present invention, the charge-up is suppressed to inhibit the dust generation. The advantage does not depend on an electric resistivity of the silicon target material according to the present invention.

Generally, it is considered as effective that the electric resistivity of the target material is low in order to inhibit the dust generation during the sputtering process. When the target material is made of the n-type silicon, a more amount of P or As as a donor impurity needs to be added as the electric resistivity is lowered. However, when a more amount of donor impurity is added, the impurity is easily introduced into the silicon-containing thin film formed by sputtering, which is not preferable in view of obtaining a high-quality film.

Thus, as the electric resistance of the silicon target material, a volume resistivity is preferably 1 Ωcm or more at a room temperature. The volume resistivity is more preferably 10 Ωcm or more, and most preferably 50 Ωcm or more.

Example

Single-crystal silicon of n-type having a resistivity of 200 Ωcm produced by a floating zone method was cut to a thickness of 5 mm. To remove a strained layer on the surface of the silicon substrate, etching was performed using a chemical solution obtained by mixing fluorine (a concentration of 50 weight %), nitric acid (a concentration of 70 weight %), and methanol at a volume ratio of 2:5:3. A 500 nm Y film was formed by sputtering as a conductive layer on one surface of the n-type silicon target material obtained as described above. A 500 nm Cr film was also formed as a metal film on the Y film. The Cr film and a backing plate of oxygen-free copper were bonded together by a bonding material containing indium as a main component, to thereby obtain a silicon target for sputtering film formation.

A 152 mm-square photomask substrate made of synthetic silica was prepared, and a MoSiON film (Mo:Si:O:N=1:4:1:4) having a film thickness of 76 nm was formed on the substrate by DC sputtering using the above silicon target. An argon gas, a nitrogen gas and an oxygen gas were used as a sputtering gas.

When defect measurement was performed on the MoSiON film obtained as describe above by using Magics 2351 manufactured by Lasertec Corporation, the number of defects having a size of 0.1 µm or more was 2. A film with only a few defects was obtained.

Comparative Example

Single-crystal silicon of n-type having a resistivity of 200 Ωcm produced by a floating zone method was cut to a thickness of 5 mm. To remove a strained layer on the surface of the silicon substrate, etching was performed using a chemical solution obtained by mixing fluorine (a concentration of 50 weight %), nitric acid (a concentration of 70 weight %), and methanol at a volume ratio of 2:5:3. A 500 nm Cr film was formed as a metal film on one surface of the n-type silicon target material obtained as described above. The Cr film and a backing plate of oxygen-free copper were bonded together by a bonding material containing indium as a main component, to thereby obtain a silicon target for sputtering film formation.

A 152 mm-square photomask substrate made of synthetic silica was prepared, and a MoSiON film (Mo:Si:O:N=1:4:1:4) having a film thickness of 76 nm was formed on the substrate by DC sputtering using the above silicon target on the same film formation conditions as those of the example. An argon gas, a nitrogen gas and an oxygen gas were used as a sputtering gas.

When defect measurement was performed on the MoSiON film obtained as describe above by using Magics 2351 manufactured by Lasertec Corporation, the number of defects having a size of 0.1 µm or more was 10, which is five times that of the example.

In the present invention, the conductive layer made of the material having a smaller work function than that of the n-type silicon target material is provided on the bonding surface of the target material. Thus, the charge-up during sputtering film formation is reduced to inhibit the dust generation. As a result, the high-quality silicon-containing thin film can be formed.

What is claimed is:

1. A method for forming a silicon-containing thin film, comprising DC sputtering in a gas comprising nitrogen and argon with a target in which a silicon target material is attached to a metallic backing plate via a bonding material, wherein:
   said silicon target material is made of silicon whose conductive type is n-type,
   a conductive layer having a thickness of 0.1 to 10 µm, and made of a material having a smaller work function than that of the silicon target material, is provided on a surface of the silicon target material on the bonding material side,
   the conductive layer is provided directly on a surface of the bonding material, and
   bonding surfaces of the conductive layer and the n-type silicon target material are in ohmic contact.

2. A method according to claim 1, wherein said conductive layer comprises at least one member selected from the group consisting of a lanthanoid element, a rare-earth element, an alkali metal element, and an alkali-earth metal element.

3. A method according to claim 1, wherein said conductive layer comprises at least one member selected from the group consisting of Y and a lanthanoid.

4. A method according to claim 1, wherein said silicon target material has a volume resistivity of 1 Ωcm or more as electric resistance at a room temperature.

5. A method according to claim 1, wherein said silicon target material is single crystal.

6. A method according to claim 2, wherein said silicon target material has a volume resistivity of 1 Ωcm or more as electric resistance at a room temperature.

7. A method according to claim 2, wherein the silicon target material is single crystal.

8. A method according to claim 3, wherein the silicon target material has a volume resistivity of 1 Ωcm or more as electric resistance at a room temperature.

9. A method according to claim 3, wherein the silicon target material is single crystal.

* * * * *